United States Patent
Asa

(10) Patent No.: US 9,666,586 B2
(45) Date of Patent: May 30, 2017

(54) CMOS COMPATIBLE MEMORY CELLS

(71) Applicant: Gil Asa, Zichron Yaakov (IL)

(72) Inventor: Gil Asa, Zichron Yaakov (IL)

( * ) Notice: Subject to any disclaimer, the term of this patent is extended or adjusted under 35 U.S.C. 154(b) by 87 days.

(21) Appl. No.: 14/459,403

(22) Filed: Aug. 14, 2014

(65) Prior Publication Data

US 2016/0049403 A1    Feb. 18, 2016

(51) Int. Cl.
| H01L 29/74 | (2006.01) |
| H01L 27/11 | (2006.01) |
| H01L 21/265 | (2006.01) |
| H01L 29/10 | (2006.01) |
| H01L 29/06 | (2006.01) |
| G11C 11/412 | (2006.01) |
| H01L 27/02 | (2006.01) |

(52) U.S. Cl.
CPC ........ H01L 27/1104 (2013.01); G11C 11/412 (2013.01); H01L 21/26513 (2013.01); H01L 29/0653 (2013.01); H01L 29/1095 (2013.01); H01L 27/0207 (2013.01)

(58) Field of Classification Search
CPC . H01L 27/11; H01L 27/0207; H01L 27/0922; H01L 29/0692
See application file for complete search history.

(56) References Cited

U.S. PATENT DOCUMENTS

| 5,594,683 A * | 1/1997 | Chen ................. G11C 11/40 257/273 |
| 6,104,045 A * | 8/2000 | Forbes ............... H01L 27/1027 257/140 |
| 2004/0004298 A1 * | 1/2004 | Madurawe ......... H01L 27/0688 257/314 |
| 2004/0038466 A1 * | 2/2004 | Yen .................. H01L 21/28194 438/197 |
| 2006/0049435 A1 | 3/2006 | Bill et al. |
| 2007/0241383 A1 * | 10/2007 | Lin ....................... H01L 27/115 257/313 |
| 2009/0212342 A1 * | 8/2009 | Roizin ................ G11C 16/10 257/316 |
| 2010/0097853 A1 | 4/2010 | Rountree |
| 2013/0166990 A1 * | 6/2013 | Morris ............... G06F 11/0793 714/764 |
| 2014/0191328 A1 * | 7/2014 | Tsuruta .............. H01L 27/0207 257/371 |
| 2016/0093628 A1 * | 3/2016 | Chen ................. H01L 29/66825 257/296 |

* cited by examiner

*Primary Examiner* — Bradley K Smith
*Assistant Examiner* — David Goodwin
(74) *Attorney, Agent, or Firm* — Pearl Cohen Zedek Latzer Baratz LLP

(57) ABSTRACT

A memory cell and a process for production thereof, the memory cell having a CMOS substrate having two adjacent wells of opposite conductivity types, having trench isolation between the wells, wherein one of the wells is connected to a ground voltage level and the other one to a constant voltage level; a shallow lightly doped n layer in a first one of the wells; a shallow lightly doped p layer in a second one of the wells; at least a first and second deep heavily doped p regions in the first well; at least a first and second deep heavily doped n regions in the second well; and a conductor to connect the first and second deep p regions, the shallow n region, the first and second deep n regions and the shallow p region to the same input voltage level relative to the ground voltage level.

10 Claims, 5 Drawing Sheets

CMOS COMPATIBLE MEMORY CELLS

BACKGROUND OF THE INVENTION

Some known FET memory cells are compatible with dynamic or static random access memories. Some of these cells may include coupled junction field effect transistors with different conductivity types and an access transistor. It is desired in the memory cells industry to conform the production process of the cell to the regular CMOS process as much as possible, and to make the cells as compact as possible.

SUMMARY OF THE INVENTION

Some embodiments of the present invention may provide a memory cell that may include: a CMOS substrate having two adjacent wells of opposite conductivity types, having trench isolation between the wells, wherein one of the wells is connectable to a ground voltage level and the other one to a constant voltage level; a shallow lightly doped n layer in a first one of the wells; a shallow lightly doped p layer in a second one of the wells; at least a first and second deep heavily doped p regions in the first well, the first deep p region adjacent to the trench, so that a shallow n region of the shallow lightly doped n layer is left between the first and second deep p regions; at least a first and second deep heavily doped n regions in the second well, the first deep n region adjacent to the trench, so that a shallow p region of the shallow lightly doped p layer is left between the first and second deep n regions, wherein the production of the shallow lightly doped n and p layers and the deep heavily doped p and n regions is performed in a regular manner used for forming of such elements during a CMOS process; and a conductor to connect the first and second deep p regions, the shallow n region, the first and second deep n regions and the shallow p region to the same input voltage level relative to the ground voltage level, the input voltage level is switchable between the ground voltage level and the constant voltage level.

In some embodiments of the present invention, the CMOS substrate may include a control gate on the first well, wherein the at least first and second deep heavily doped p regions in the first well may include three deep heavily doped p regions in the first well, a third and the second of the deep p regions on either side of the control gate, wherein the third deep p region may be configured to operate as a bit-line node.

In some embodiments of the present invention, the shallow lightly doped n layer in the first well may include shallow lightly doped n layer regions in two sides of the control gate of the first well.

In some embodiments of the present invention, the CMOS substrate may include a control gate on the second well, wherein the at least first and second deep heavily doped n regions in the second well may include three deep heavily doped n regions in the second well, a third and the second of the deep n regions on either side of the control gate of the second well, wherein the third deep n region may be configured to operate as a bit-line node.

In some embodiments of the present invention, the shallow lightly doped p layer in the second well may include shallow lightly doped p layer regions in two sides of the control gate of the second well.

In some embodiments of the present invention, the CMOS substrate may include a control gate on each of the wells, wherein the at least first and second deep heavily doped p regions in the first well may include three deep heavily doped p regions in the first well, a third and the second of the deep p regions on either side of the control gate of the first well, and wherein the at least first and second deep heavily doped n regions in the second well may include three deep heavily doped n regions in the second well, a third and the second of the deep n regions on either side of the control gate of the second well, wherein one of the third deep n region and the third deep p region may be configured to operate as a bit-line node. In some embodiments, at least one of the control gates function as a "dummy gate" in a cut off mode, configured to enable separation of the cell from a neighbor cell.

In some embodiments of the present invention, the shallow lightly doped n layer in the first well may include shallow lightly doped n layer regions in two sides of the control gate of the first well, and wherein the shallow lightly doped p layer in the second well may include shallow lightly doped p layer regions in two sides of the control gate of the second well.

In some embodiments of the present invention, the regions of the memory cell, when viewed from above, are arranged sequentially in a raw with a constant width.

In some embodiments of the present invention, the cell further includes a Shallow Trench Isolation (STI) on sides of the cell that isolates it from neighbor cells.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1A:
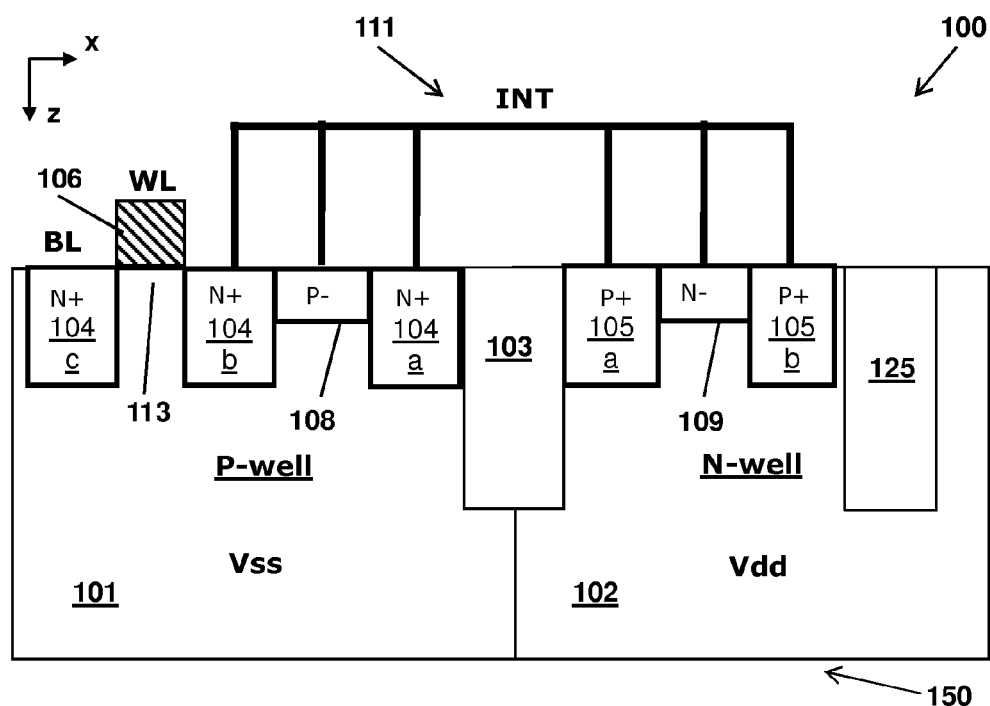
FIGS. 1A, 1B and 1C are schematic illustrations of an exemplary memory cell according to embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The present invention provides a very compact and efficient memory cell, wherein the process of production of the memory cell is compatible with complementary metal-oxide-semiconductor (CMOS) process.

Figure 1B:
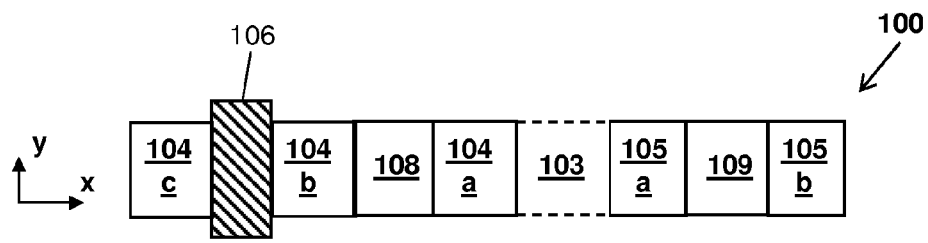
Figure 1C:
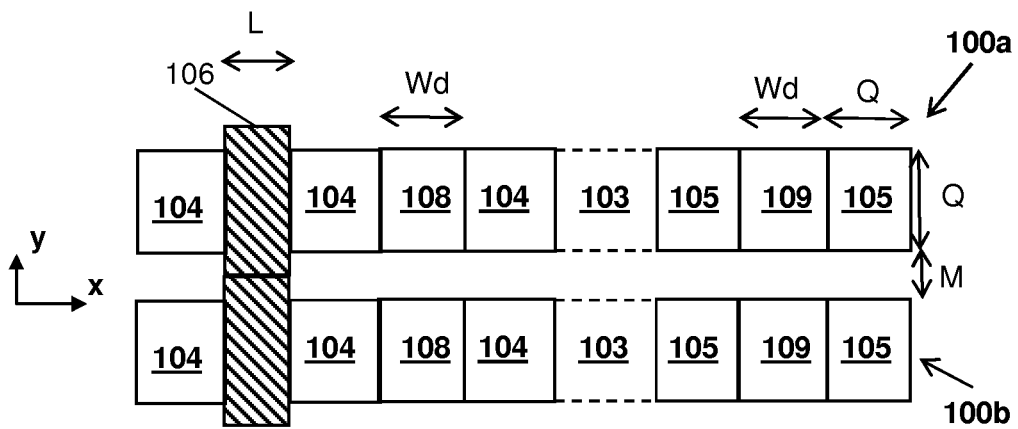

Reference is now made to FIGS. 1A, 1B and 1C, which are schematic illustrations of an exemplary memory cell 100 according to embodiments of the present invention. FIG. 1A is a schematic cross-sectional illustration of memory cell 100 in an x-z plane, and FIG. 1B is a schematic illustration from above of memory cell 100, i.e., in an x-y plane. Memory cell 100 may include a CMOS substrate 150 having two adjacent wells 101 and 102 of opposite conductivity types and trench isolation 103 between the wells, such as, for example a sallow trench isolation (STI), which may be filled with field oxide as known in the art. For example, well 101 may be a p-well and well 102 may be a n-well. P-well 101 may be at a voltage level Vss (for example, ground) and may include, for example, a shallow lightly doped p region 108 between two deep heavily doped n regions 104, for example 104a and 104b. The ratio of depths between the deep n regions and the shallow p regions may be the customary ratio between deep n regions and p shallow regions in standard CMOS process, as long as Vdd is at a minimal value for a required leakage specifications. For example, a 28 nm technology and required leakage of less than 1 pA will require Vdd to be around 2V. One of deep n regions 104, for example region 104a, may be adjacent to trench 103 on one side and to shallow region 108 on the other side, and another deep n region 104, for example 104b, may be aligned in the other side of shallow region 108. N-well 102 may be at a certain constant voltage level Vdd and may include, for example, a shallow lightly doped n region 109 between two deep heavily doped p regions 105, for example 105a and 105b. One of deep n regions 105, for example 105a, may be adjacent to trench 103 on one side and to shallow region 109 on the other side, and another deep n region 105, for example 105b, may be aligned in the other side of shallow region 109.

In some embodiments of the present invention, the approximate ratio of depth between the deep regions and the shallow regions may be, for example, about 2:1 to 3:1 or more. For example, in some exemplary embodiments, the depth of the deep region may be about 100 nm and the depth of the shallow region may be about 50 nm, wherein the depth of the wells may be about 200 nm or more. The greater the ratio of depths between the deep regions and the shallow regions, the better a memory cell according to embodiments of the present invention may function.

The size of cell 100 may be much smaller, for example, about three times smaller, than the size of a usual high density CMOS cell. The maximal width of the shallow lightly doped regions 108 and 109 is the maximal depletion width Wd, of a depletion that may occur between the heavily doped regions 104a and 104b, and between the heavily doped regions 105a and 105b, as described in detail herein with reference to FIGS. 4A and 4B. If Q is the diffusion minimal size (length and width), M is the distance between cells 100a and 100b, and L is the width of a control gate 106, as shown in FIG. 1C, then the cell size may be about (Q+M) by (6Q+2Wd+L), or approximately (Q+M) by (8Q+L), which is about three times smaller than a usual high density CMOS cell.

Additionally, cell 100 includes STI(s) on sides of the cell that isolates it from the neighbor cells, such as STI 125, which may be formed around cell 100. Although the drawings (FIGS. 1, 4A and 4B) show a cross section of STI 125 only on one side of the cell, it will be appreciated that STI 125 may continue behind, in front and/or on the other side of cell 100.

Additionally, memory cell 100 includes a conductor 111 to connect region 108 and the adjacent regions 104a and 104b and region 109 and the adjacent regions 105a and 105b to a same input voltage level, for example switchable between the voltage level Vss (for example, ground) and the voltage level Vdd. In some embodiments, for example as shown in FIG. 5B, region 108 and the adjacent regions 104a and 104b may be coated with a mutual conductive layer, so as to enable one mutual contact with a conductor 111 from any suitable and/or convenient point upon the conductive layer. Similarly, region 109 and the adjacent regions 105a and 105b may be coated with a mutual conductive layer, so as to enable one mutual contact with a conductor 111 from any suitable and/or convenient point upon the conductive layer.

It will be appreciated that, in this application, the terminology of a "lightly doped layer/region" refers to implanted layer which is much lighter than a "heavily doped layer/region" but still much doped compared to the well or the substrate. For example, in some embodiments, the doping density of a lightly doped layer/region may be about 50 to 100 times greater than the density of the well, and, the doping density of a heavily doped layer/region may be about 50 to 100 times greater than the density of a lightly doped layer/region. For example, in some embodiments, the order of magnitude of the well density may be about $10^{17}$ ions/$cm^3$, the order of magnitude of a lightly doped layer/region density may be about $10^{19}$ ions/$cm^3$ and the order of magnitude of a heavily doped layer/region density may be about $10^{21}$ ions/$cm^3$. In the drawings, the shallow lightly doped n and p regions are indicated by N− and P−, respectively, as customary in the art. The deep heavily doped n and p regions are indicated by N+ and P+, respectively, as customary in the art.

The production of the doped regions and other elements of memory cell 100 described herein is performed in a regular manner used for forming of such elements during a CMOS process. An exemplary process according to embodiments of the present invention in which memory cell 100 is produced is described in detail herein with reference to FIGS. 5A-5C and 6. Therefore, the rest of the cells produced in the production line may be unchanged from the known regular transistors and/or may be produced in a regular process.

Memory cell 100 may include in p-well 101 a shallow lightly doped p layer (as shown, for example, in FIGS. 5A and 5B), wherein the deep heavily doped n regions 104 are implemented, for example, over the shallow lightly doped p layer, so that shallow p region 108 of the shallow lightly doped p layer is left between two deep n regions 104a and 104b. In n-well 102, memory cell 100 may include a shallow lightly doped n layer (as shown, for example, in FIGS. 5A and 5B), wherein the deep heavily doped p regions 105 are implemented, for example, over the shallow lightly doped n layer, so that shallow n region 109 of the shallow lightly doped n layer is left between two deep p regions 105a and 105b. The production of the shallow lightly doped n and p layers and the deep heavily doped p and n regions is performed in a regular manner used for forming of such elements during a CMOS process. By this manner of production, it may be assured that the regions 104a, 108 and 104b and the regions 105a, 109 and 105b are self-aligned adjacently with no spaces between them.

In some embodiments, memory cell 100 may include a control gate 106 on either well 101 or 102. Memory cell 100 may include a dielectric layer 113 between control gate 106 and CMOS substrate 150, for example gate oxide layer as known in the art. Further, control gate 106 may include sidewall spacers at the sides of the gate, for example in order to isolate gate 106 from connection to conductor 111.

Figure 5A:
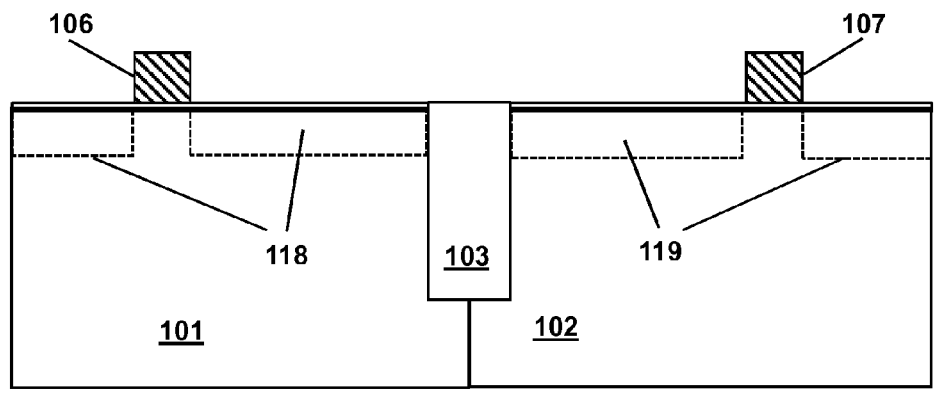
FIGS. 5A-5C are schematic illustrations of an exemplary production process of an exemplary memory cell according to embodiments of the present invention.
Figure 5B:
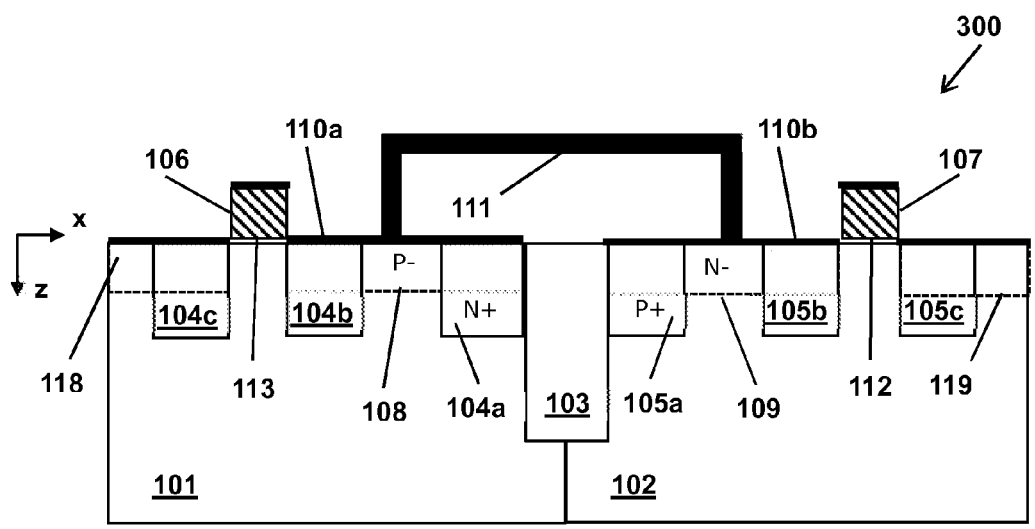
Figure 5C:
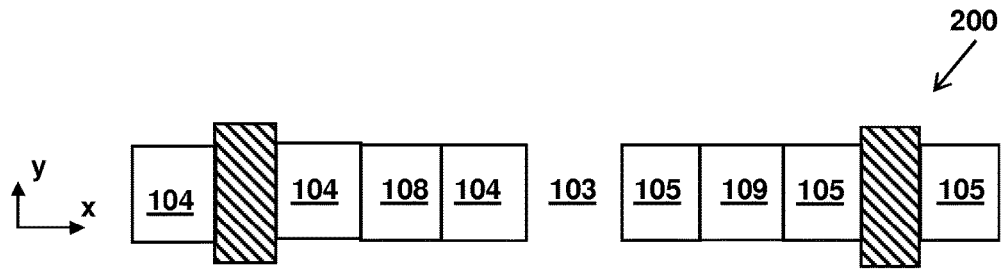

In some embodiments, memory cell may include a control gate on each of the wells 101 and 102 (as shown, for example in FIGS. 5A-5C). In case control gate 106 is on well 101, cell 100 may include an additional deep heavily doped n region 104c, wherein deep n regions 104b and 104c are each on either side of control gate 106 of well 101. In this case, the shallow lightly doped p layer in well 101 may include shallow lightly doped p layer regions in two sides of the control gate, for example as shown in FIGS. 5A and 5B, for example because the shallow lightly doped p layer is formed after the control gate is produced on the well, which may prevent the implementing of the doped layer beneath the gate. By this manner of production, it may be assured that shallow lightly doped p layer regions are self-aligned with the control gate. Deep n region 104c may be configured to operate as a bit-line node and/or form a bit-line transistor.

Similarly, in case well 102 has a control gate on it, additionally or instead of control gate 106 of well 101, cell 100 may include an additional deep heavily doped p region 105c, as shown, for example, in FIG. 5B, wherein deep p regions 105b and 105c are each on either side of the control gate of well 102. In this case, the shallow lightly doped n layer in well 102 may include shallow lightly doped n layer regions in two sides of the control gate, for example as shown in FIGS. 5A and 5B, for example because the shallow lightly doped n layer is formed after the control gate is produced on the well, which may prevent the implementing of the doped layer beneath the control gate. By this manner of production, it may be assured that shallow lightly doped p layer regions are self-aligned with the control gate. Deep p region 105c may be configured to operate as a bit-line node and/or form a bit-line transistor.

Control gate 106 and/or other gates included in cell 100 may be a poly-silicon gate or a gate of any other suitable kind or material. Control gate 106 and/or other gates included in cell 100 may be configured to operate as and/or be connected to a write line.

Control gate 106 and/or other gates included in cell 100 and/or the bit-line transistor(s) formed with deep p region 104c and/or 105c may be produced in a regular manner used for forming of such elements during a CMOS process. Additionally or alternatively to control gate 106 and/or to the bit-line formed with deep p region 104c and/or 105c, cell 100 may include a FinFET transistor or any other suitable kind of transistor.

As shown in FIG. 1B, when viewed from above, the regions of memory cell 100 are arranged sequentially in a raw with a constant width. This form of cell 100 makes memory cell 100 very compact and, for example, very convenient for use in very small devices and/or in order to save space. FIG. 1C illustrates two adjacent memory cells 100a and 100b, each similar to memory cell 100. The form of memory cell 100 enables area-economical arrangement of cells on the substrate, so that more cells 100 may be formed on a given area of substrate.

Returning to FIG. 1A, p-well 101, deep n regions 104a and 104b and shallow p region 108 may form together a vertical p-channel junction gate field-effect transistor (vertical JFET or VJFET). The vertical p-channel JFET may include a gate region formed by deep n regions 104a and 104b, which may be called herein gate regions 104a and 104b. Shallow p region 108 may constitute a source region 108, and p-well 101 may constitute a drain 101. Similarly, n-well 102, deep p regions 105a and 105b and shallow n region 109 may form together a vertical n-channel junction gate field-effect transistor (vertical JFET or VJFET). The vertical n-channel JFET may include a gate region formed by deep p regions 105a and 105b, which may be called herein gate regions 105a and 105b. Shallow n region 109 may constitute a source region 109, and n-well 102 may constitute a drain 102.

Figure 2:
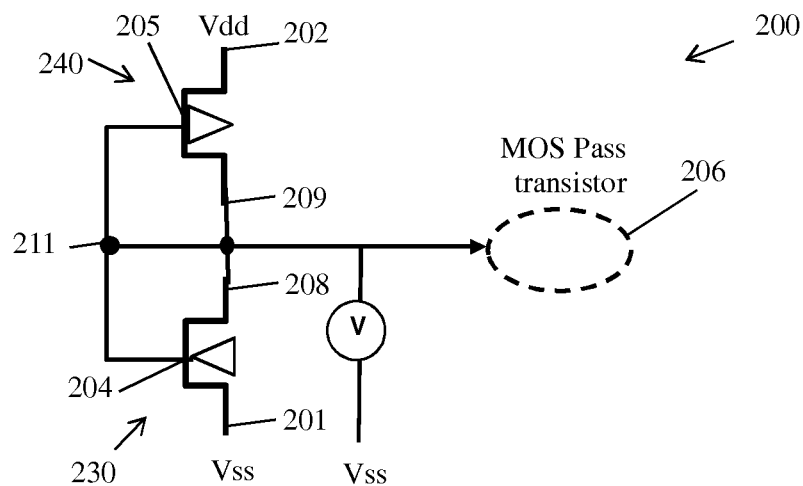
FIG. 2, which is an exemplary schematic simplified circuit illustration of an exemplary memory cell according to embodiments of the present invention.

Reference is now made to FIG. 2, which is an exemplary schematic simplified circuit illustration 200 of a memory cell 100 according to embodiments of the present invention. Cell illustration 200 may include p-channel JFET 230 and n-channel JFET 240. P-channel 230 may include source 208, drain 201 and gate 204. Source 208 in the exemplary simplified illustration of FIG. 2 may represent the function and role of source region 108 of cell 100. Drain 201 may represent the role and function of drain 101 of cell 100. Gate 204 may represent the role and function of gate regions 104a and 104b. Similarly, n-channel 240 may include source 209, drain 202 and gate 205. Source 209 in the exemplary simplified illustration of FIG. 2 may represent the function and role of source region 109 of cell 100. Drain 202 may represent the role and function of drain 102 of cell 100. Gate 205 may represent the role and function of gate regions 105a and 105b. Drain 201 is connected to voltage level Vss, which may be, for example, a negative/ground voltage level. Drain 202 is connected to voltage level Vdd higher than Vss, for example a positive voltage level. The voltage difference between Vdd and Vss may be a voltage difference sufficient to create a depletion region that may block the p-channel or n-channel according to some embodiments of the present invention, as described in detail herein.

When drain 201 and gate 204 are at the same voltage level, although the p-channel is open, substantially no current flows from source 208 to drain 201. However, when a voltage difference between gate 204 and drain 201 grows, the p-channel may become narrower and, at a certain voltage level, drain 201 is isolated from source 208, and no current can flow between them. When drain 202 and gate 205 are at the same voltage level, although the n-channel is open, substantially no current flows from source 209 to drain 202. However, when a voltage difference between gate 205 and drain 202 grows, the n-channel may become narrower and, at a certain voltage level, drain 202 is isolated from source 209, and no current can flow between them.

As shown in FIG. 2, sources 208 and 209 and gates 204 and 205 are all connected to and kept at the same voltage level V at point 211. Similarly, conductor 111 of cell 100 connects source 108, gate regions 104a and 104b, source 109 and source regions 105a and 105b to a same input voltage level, for example switchable between the voltage level Vss (for example, ground) and the voltage level Vdd. The voltage level V at point 211 is determined by, for example, MOS pass transistor 206. By switching of voltage level V between Vss and Vdd, pass transistor 206 may write '0' or '1' states to memory cell 1, and/or switch between the '0' and '1' states of memory cell 100. In FIG. 1, bit-line node 104c and control gate 106 may form the MOS pass transistor, wherein the output voltage of the MOS pass transistor 206 is determined according to the input entered by the bit-line at bit-line node 104c. For example, the input voltage at bit-line node 104c, may determine the voltage at gate region 104b and at conductor 111. As mentioned above, the input voltage level V may be determined by a FinFET transistor or any other suitable kind of transistor, and or a FinFET transistor or any other suitable kind of transistor may be included in MOS pass transistor 206. Control gate 106 may activate and deactivate pass transistor 206.

According to some embodiments of the present invention, the voltage level V at point 211, determined by MOS pass transistor 206, may be switched by transistor 206 between Vss (for example, ground) voltage level and Vdd. When voltage level V is at Vdd, source 208 and gate 204 is at Vdd while drain 201 is at Vss. The voltage difference between Vdd at gate 204 and Vss at drain 201 causes blocking of the p-channel between source 208 and drain 201. At the same time, source 209, gate 205 and drain 202 are all at Vdd and the n-channel between source 209 and drain 202 is open. The state in which the voltage level V at 211 is at Vdd may be read, for example, as state '1' of memory cell 100.

Similarly, when voltage level V is at Vss, source 209 and gate 205 is at Vss while drain 202 is at Vdd. The voltage difference between Vss at gate 205 and Vdd at drain 202 causes blocking of the n-channel between source 209 and drain 202. At the same time, source 208, gate 204 and drain 201 are all at Vdd, and the p-channel between source 208 and drain 201 is open. The state in which the voltage level V at 211 is at Vss may be read, for example, as state '0' of memory cell 100.

Figure 3:
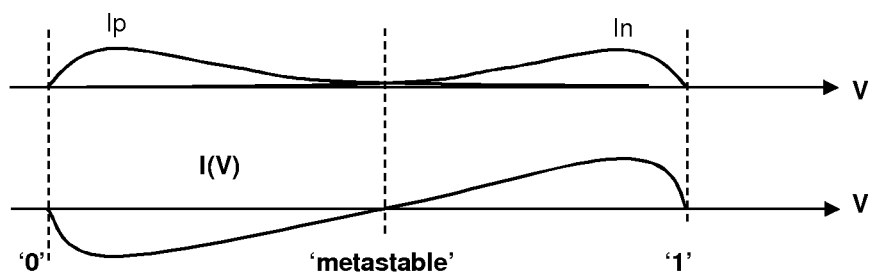
FIG. 3 is a schematic diagram illustrating the states of an exemplary memory cell according to embodiments of the present invention.

Reference is now made to FIG. 3, which is a schematic diagram illustrating the states of memory cell 100 according to some embodiments of the present invention. FIG. 3 illustrates the current Ip at p-channel JFET 230, the current In at n-channel JFET 240, and the total current I(V) going through memory cell 100, wherein Ip flows in opposite direction relative to In.

When pass transistor 206 sets the state of cell 100 to '0', e.g., the voltage at point 211 is set to Vss, e.g., when a '0' input is entered by the bit-line, there is no voltage difference between source 208 and drain 201, and therefore Ip in the p-channel JFET 230 is substantially zero. Theoretically, if the voltage difference between source 208 and drain 201 grows, the current Ip may grow correspondingly, until a depletion region at the p-channel between source 208 and drain 201 starts to interrupt the current. At small voltage differences, Ip grows linearly with the voltage difference. In larger voltage differences, the depletion region starts to restrain the current growth. In further larger voltage differences, Ip decreases with the growth of the voltage difference until the depletion region completely blocks the p-channel. When pass transistor 206 sets the voltage at point 211 to Vdd, e.g., when a '1' input is entered by the bit-line, the voltage difference between source 208 and drain 201 causes the depletion region to block the p-channel between source 208 and drain 201, and therefore Ip is substantially zero.

In the n-channel JFET 240, when pass transistor 206 sets the state of cell 100 to '1', e.g., the voltage at point 211 is set to Vdd, e.g., when a '1' input is entered by the bit-line, there is no voltage difference between source 209 and drain 202, and therefore In in the n-channel is substantially zero. Theoretically, if the voltage difference between source 209 and drain 202 grows, the current In may grow correspondingly, until a depletion region at the n-channel between source 209 and drain 202 starts to interrupt the current. At small voltage differences, In grows linearly with the voltage difference. In larger voltage differences, the depletion region starts to restrain the current growth. In further larger voltage differences, In decreases with the growth of the voltage difference until the depletion region completely blocks the n-channel. When pass transistor 206 sets the voltage at point 211 to Vss, e.g., when a '0' input is entered by the bit-line, the voltage difference between source 209 and drain 202 causes the depletion region to block the re-channel between source 209 and drain 202, and therefore In is substantially zero.

Accordingly, the current I(V) through cell 100 equals substantially zero in three states of cell 100. In state '0' and in state '1', the current in both p-channel JFET 230 and n-channel JFET 240 equals substantially zero, as discussed herein. States '0' and '1' are stable states and may not be changed until another state is written to cell 100. Additionally, there is a metastable state of cell 100 when the voltage level V at point 211 is at a metastable voltage level between Vss to Vdd, in which both the p-channel in JFET 230 and the n-channel in JFET 240 are substantially blocked by the corresponding depletion regions. In voltage levels V between Vss and the metastable voltage level, the current through cell 100 is negative, and in voltage levels V between the metastable voltage level and Vdd, the current through cell 100 is positive.

Once setting cell 100 to either '0' or '1' state, pass transistor 206 may be deactivated, for example by control gate 106. Since both the '0' and '1' states are stable, the state of cell 100 will not change after deactivation of pass transistor 206, at least until the next deactivation of pass transistor 206 and/or writing of state to cell 100.

Figure 4A:
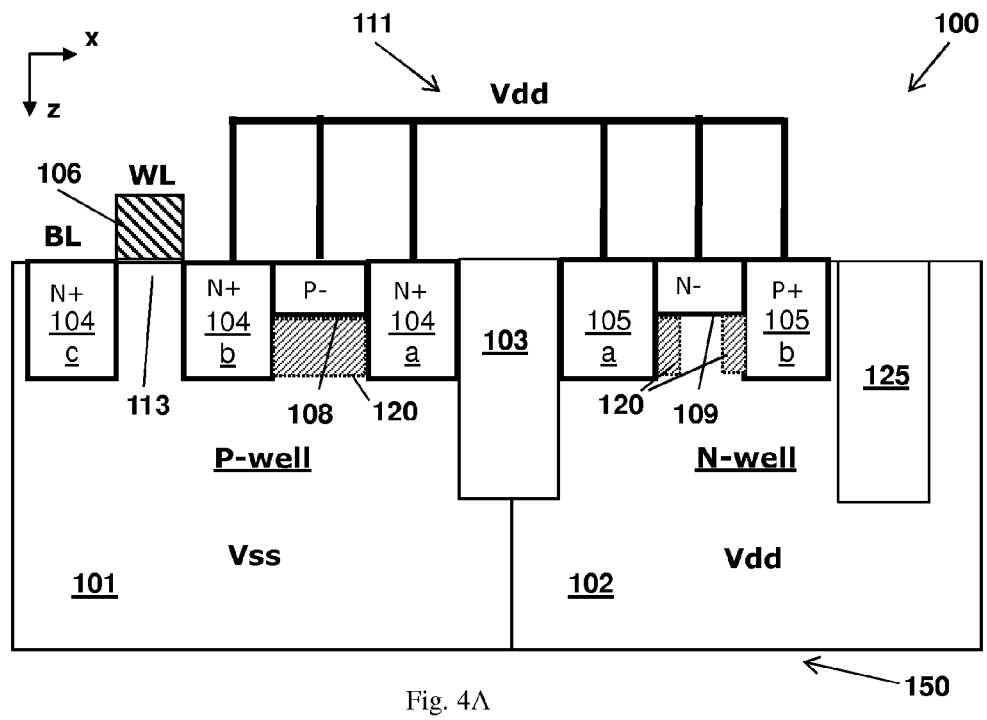
FIGS. 4A and 4B are schematic illustration of the operation of an exemplary memory cell according to embodiments of the present invention.
Figure 4B:
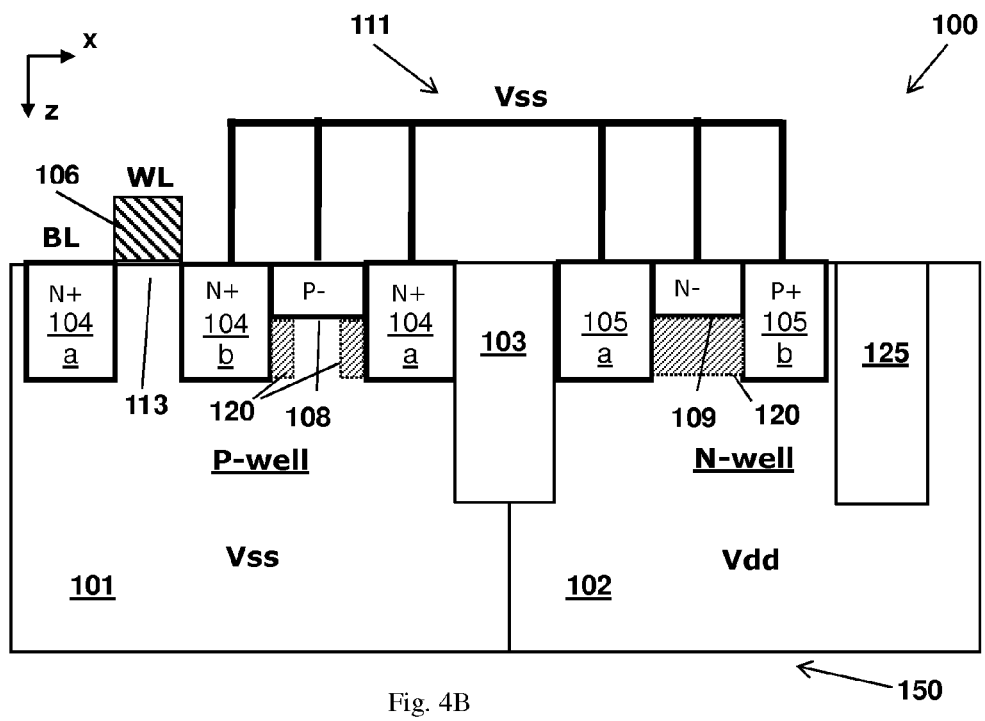

Reference is now made to FIGS. 4A and 4B, which are schematic illustrations of the operation of memory cell 100 according to some embodiments of the present invention. As mentioned herein, the gate regions 105a and 105b and the source 109 are all connected to the same voltage level by conductor 111, as well as gate regions 104a and 104b and source region 108. In FIG. 4A, a '1' state is written to cell 100 via bit-line node 104c, e.g., the input voltage level is set or switched to voltage level Vdd, for example the same voltage level in which n-well 102 is held. In this case, source 109 and drain 102 are at the same voltage level, and there are narrow depletion regions 120 in the n-channel between source 109 and drain 102, in the junction areas between gate region 105a and drain 102 and between gate region 105b and drain 102, leaving a sufficient channel for current to flow between source 109 and drain 102. However, the current in the n-channel is substantially zero because there is no voltage difference between source 109 and drain 102. In the p-channel JFET, since drain 101 is held in Vss voltage level, the voltage difference between drain 101 and source 108 may cause expending of depletion region 120 between gate regions 104a and 104b, until the p-channel between source 108 to drain 101 is completely blocked with depletion region 120, and/or drain 101 is isolated from source 108. The maximal width of each of source regions 108 and 109 is the maximal depletion width Wd, as described with reference to FIG. 1C.

In FIG. 4B, a '0' state is written to cell 100 via bit-line node 104c, e.g., the input voltage level is set or switched to voltage level Vss, for example the same voltage level in which p-well 101 is held. In this case, source 108 and drain 101 are at the same voltage level, and there are narrow depletion regions 120 in the p-channel between source 108 and drain 101, in the junction areas between gate region 104a and drain 101 and between gate region 104b and drain 101, leaving a sufficient channel for current to flow between source 108 and drain 101. However, the current in the p-channel is substantially zero because there is no voltage difference between source 108 and drain 101. In the n-channel JFET, Since drain 102 is held in Vdd voltage level, the voltage difference between drain 102 and source 109 may cause expending of depletion region 120 between gate regions 105a and 105b, until the n-channel between source 109 to drain 102 is completely blocked with depletion region 120, and/or drain 102 is isolated from source 109.

According to some embodiments of the present invention, in writing T it is sufficient to force internal voltage V slightly bigger than the metastable voltage level. This will dictate increasingly growing current of the pull up transistor (such as n-channel transistor 240) and concurrently decaying of the pull down transistor (such as p-channel transistor 230) until the cell is "swept" to holding '1' state. Vice versa, in writing '0' it is sufficient to force internal voltage V slightly smaller than the metastable point. This is a regenerative feature of a SRAM cell such as cell 100 according to embodiments of the present invention. The internal voltage V of the cell may be disturbed momentarily from its logical '1' or '0', for example, when reading the cell, but as long as the internal voltage V doesn't cross the metastable point it will regenerate itself quickly to the nondisturbed (stable) value ('0' or '1').

Reference is now made to FIGS. 5A-5C, which are schematic illustrations of an exemplary production process of memory cell 300 according to some embodiments of the present invention. FIG. 5A is a schematic cross-sectional illustration of a partially produced memory cell 300 in an x-z plane, FIG. 5B is a schematic cross-sectional illustration of a fully produced memory cell 300 in an x-z plane, and FIG. 5C is a schematic illustration from above of memory cell 100, i.e., in an x-y plane.

In memory cell 300, as shown in FIG. 5B, region 108 and the adjacent regions 104a and 104b are coated with a mutual conductive layer 110a, so as to enable one mutual contact with a conductor 111 from any suitable and/or convenient point upon conductive layer 110a, and similarly, region 109 and the adjacent regions 105a and 105b may be coated with a mutual conductive layer 110b, so as to enable one mutual contact with a conductor 111 from any suitable and/or convenient point upon conductive layer 110b. Additionally, in memory cell 300, well 102 has a control gate 107 and an additional deep heavily doped p region 105c, wherein deep p regions 105b and 105c are each on either side of control gate 107 of well 102. Deep p region 105c may be configured to operate as a bit-line node and/or form a bit-line transistor. Besides those differences, memory cell 300 may be identical to cell 100. The production process described herein with reference to cell 300 may be similar to the production process of cell, with the required changes.

In the production process, a CMOS substrate 150 may be provided, having two adjacent wells 101 and 102 of opposite conductivity types and trench isolation 103 between the wells, such as, for example a sallow trench isolation (STI), which may be filled with field oxide as known in the art. For example, well 101 may be a p-well and well 102 may be a n-well. P-well 101 may be at a voltage level Vss (for example, ground). N-well 102 may be at a certain constant voltage level Vdd.

On either well 101 or 102, a control gate 106 and/or 107 may be produced, respectively. Between the control gate 106 and/or 107, and CMOS substrate 150, a dielectric layer 113 and/or 112 may be produced, respectively, for example gate oxide layer as known in the art. Further, sidewall spacers (not shown in the Figures) may be produced at the sides of gate 106 and/or gate 107, for example in order to isolate gate 106 and/or gate 107 from connection to conductor 111.

Control gate(s) 106 and/or 107 may be a poly-silicon gate or a gate of any other suitable kind or material. Control gate(s) 106 and/or 107 may be configured to operate as and/or be connected to a write line. Well 101, well 102, trench isolation 103 and/or control gate(s) 106 and/or 107 may be produced in a regular manner used for forming of such elements during a CMOS process. Additionally or alternatively to, or included in, control gate(s) 106 and/or 107, cell 100 may include a FinFET transistor or any other suitable kind of transistor. Additionally according to some embodiments of the present invention, at least one of the control gates 106 and/or 107 may function as a "dummy gate" in a cut off mode, for example thus enabling separation of cell 100 from the neighbor cell (for example, thus replacing the STI and saving area). Alternatively, if both gates 106 and 107 are "word lines controls", the cell may become suitable to perform as a dual port SRAM, at least four times smaller than standard dual port SRAM.

Then, a shallow lightly doped p layer 118 may be produced in p-well 101, and a shallow lightly doped n layer 119 may be produced in n-well 102. The production of the shallow lightly doped n and p layers 118 and 119 may be performed in a regular manner used for forming of such elements during a CMOS process. Shallow lightly doped p layer 118 in well 101 may include shallow lightly doped p layer regions of layer 118 in two sides of control gate 106, and/or shallow lightly doped n layer 119 in well 102 may include shallow lightly doped n layer regions of layer 119 in two sides of control gate 107, for example as shown in FIGS. 5A and 5B, for example because shallow lightly doped p layer 118 and n layer 119 are formed after the control gate is produced on the wells, which may prevent the implementing of the doped layer beneath gate(s) 106 and/or 107. By this manner of production, it may be assured that shallow lightly doped p layer regions of layer 118 are self-aligned with control gate 106, and/or that shallow lightly doped n layer regions of layer 119 are self-aligned with control gate 107.

Over shallow lightly doped p layer 118, deep heavily doped n regions 104, for example 104a and 104b, and optionally additional deep heavily doped n region 104c, may be produced in p-well 101. Deep heavily doped n regions 104 are implemented over shallow lightly doped p layer 118, so that shallow p region 108 of the shallow lightly doped p layer is left between two deep n regions 104a and 104b. One of deep n regions 104, for example region 104a, may be adjacent to trench 103 on one side and to shallow region 108 on the other side, and another deep n region 104, for example 104b, may be aligned in the other side of shallow region 108.

Over shallow lightly doped n layer 119, deep heavily doped p regions 105, for example 105a and 105b, and optionally additional deep heavily doped p region 105c, may be produced in n-well 102. Deep heavily doped p regions 105 are implemented over shallow lightly doped n layer 119, so that shallow n region 109 of the shallow lightly doped n layer is left between two deep p regions 105a and 105b. One of deep p regions 105, for example region 105a, may be adjacent to trench 103 on one side and to shallow region 109 on the other side, and another deep p region 105, for example 105b, may be aligned in the other side of shallow region 109.

The production of shallow lightly doped n and p layers 118 and 119 and deep heavily doped p and n regions 104 and 105 is performed in a regular manner used for forming of such elements during a CMOS process. By this manner of production, it may be assured that the regions 104a, 108 and 104b and the regions 105a, 109 and 105b are self-aligned adjacently with no spaces between them.

Finally, a conductor 111 to connect region 108 and the adjacent regions 104a and 104b and region 109 and the adjacent regions 105a and 105b to a same input voltage level may be produced. As shown in FIG. 5B, region 108 and the adjacent regions 104a and 104b may be coated with a mutual conductive layer 110a, and region 109 and the adjacent regions 105a and 105b may be coated with a mutual conductive layer 110b, so as to enable one mutual contact with a conductor 111 from any suitable and/or convenient point upon the conductive layer.

The production of the doped regions and other elements of memory cell 100 described herein is performed in a regular manner used for forming of such elements during a CMOS process. An exemplary process according to some embodiments of the present invention in which memory cell 100 is produced is described in detail herein with reference to FIG. 6. Therefore, the rest of the cells produced in the production line may be unchanged from the known regular transistors and/or may be produced in a regular process.

In some embodiments, memory cell 100 may include a control gate 106 or 107 on either well 101 or 102. Memory cell 100 may include a dielectric layer 113 or 112 between the control gate and CMOS substrate 150, for example gate oxide layer as known in the art. In some embodiments, memory cell may include a control gate on each of the wells 101 and 102 (as shown, for example in FIGS. 5A-5C). In case control gate 106 is on well 101, an additional deep heavily doped n region 104c may be produced, wherein deep n regions 104b and 104c are each on either side of control gate 106 of well 101. In this case, deep n region 104c may be configured to operate as a bit-line node and/or form a bit-line transistor.

Similarly, in case well 102 has a control gate 107 on it, additionally or instead of control gate 106 of well 101, cell 100 may include an additional deep heavily doped p region 105c, as shown, for example, in FIG. 5B, wherein deep p regions 105b and 105c are each on either side of control gate of well 102. In this case, deep p region 105c may be configured to operate as a bit-line node and/or form a bit-line transistor. Control gate(s) 106 and/or 107 and/or the bit-line transistor(s) formed with deep p region 104c and/or 105c may be produced in a regular manner used for forming of such elements during a CMOS process. Additionally or alternatively to control gate 106 and/or to the bit-line formed with deep p region 104c and/or 105c, cell 100 may include a FinFET transistor or any other suitable kind of transistor.

As shown in FIG. 5C, when viewed from above, the regions of memory cell 300 are arranged sequentially in a raw with a constant width. This form of cell 300 makes memory cell 300 very compact and, for example, very convenient for use in very small devices and/or in order to save space. The form of memory cell 300 enables area-economical arrangement of cells on the substrate, so that more cells 300 may be formed on a given area of substrate.

Figure 6:
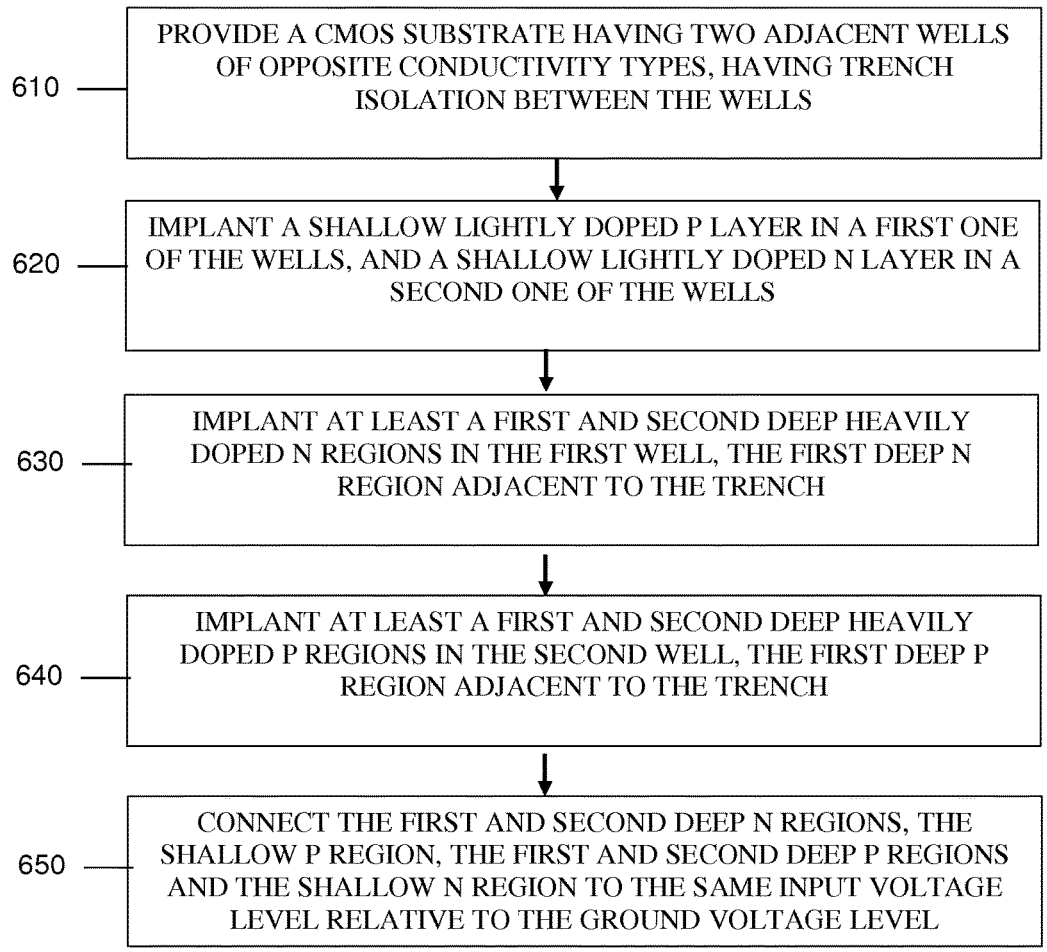
FIG. 6 is a schematic flowchart illustration of an exemplary method for production of an exemplary memory cell according to embodiments of the present invention.

Reference is now made to FIG. 6, which is a schematic flowchart illustration of an exemplary process for production of a memory cell according to some embodiments of the present invention. As indicated in block 610, the process may include providing a CMOS substrate having two adjacent wells of opposite conductivity types, having trench isolation between the wells, for example as described in detail above. One of the wells may be connected to a ground voltage level and the other one to a constant voltage level. As indicated in block 620, the process may include implanting a shallow lightly doped p layer in a first one of the wells, and a shallow lightly doped n layer in a second one of the wells, for example as described in detail above.

As indicated in block 630, the process may include implanting at least a first and second deep heavily doped n regions in the first well, the first deep n region adjacent to the trench, so that a shallow p region of the shallow lightly doped p layer is left between the first and second deep n regions, for example as indicated in detail above. As indicated in block 640, the process may include, for example, implanting at least a first and second deep heavily doped p regions in the second well, the first deep p region adjacent to the trench, so that a shallow n region of the shallow lightly doped n layer is left between the first and second deep p regions, for example as described in detail above. The production of the shallow lightly doped p and n layers and the deep heavily doped n and p regions may be performed in a regular manner used for forming of such elements during a CMOS process.

As indicated in block 650, the process may include connecting the first and second deep n regions, the shallow p region, the first and second deep p regions and the shallow n region to the same input voltage level relative to the ground voltage level, the input voltage level is switchable between the ground voltage level and the constant voltage level, for example as described in detail above.

In some embodiments of the present invention, the CMOS substrate may include a control gate on the first well, wherein the implanting of the at least first and second deep heavily doped n regions in the first well may include implanting three deep heavily doped n regions in the first well, a third and the second of the deep n regions on either sides of the control gate, wherein the third deep n region may be configured to operate as a bit-line node, for example as described in detail above. In some embodiments, the implanting of the shallow lightly doped p layer in the first well produces shallow lightly doped p layer regions in two sides of the control gate, for example as described in detail above.

In some embodiments of the present invention, the CMOS substrate may include a control gate on each of the wells, wherein the implanting of the at least first and second deep heavily doped p regions in the second well may include implanting three deep heavily doped p regions in the second well, a third and the second of the deep p regions on either sides of the control gate, wherein the third deep p region is configured to operate as a bit-line node, for example as described in detail above. In some embodiments, the implanting of the shallow lightly doped n layer in the second well produces shallow lightly doped n layer regions in two sides of the control gate, for example as described in detail above.

It will be appreciated that other exemplary processes are possible according to embodiments of the present invention. For example, variations on the above described process are possible.

In some embodiments of the present invention, another exemplary process may include, for example, implanting a shallow lightly doped n layer in a first one of the wells, implanting a shallow lightly doped p layer in a second one of the wells, implanting at least a first and second deep heavily doped p regions in the first well, the first deep p region adjacent to the trench, so that a shallow n region of the shallow lightly doped n layer is left between the first and second deep p regions, implanting at least a first and second deep heavily doped n regions in the second well, the first deep n region adjacent to the trench, so that a shallow p region of the shallow lightly doped p layer is left between the first and second deep n regions, wherein the production of the shallow lightly doped n and p layers and the deep heavily doped p and n regions is performed in a regular manner used for forming of such elements during a CMOS process, and connecting the first and second deep p regions, the shallow n region, the first and second deep n regions and the shallow p region to the same input voltage level relative to the ground voltage level, the input voltage level is switchable between the ground voltage level and the constant voltage level.

Further, in the another exemplary process, the CMOS substrate may include a control gate on the first well, wherein the implanting of the at least first and second deep heavily doped p regions in the first well may include implanting three deep heavily doped p regions in the first well, a third and the second of the deep p regions on either sides of the control gate, wherein the third deep p region is configured to operate as a bit-line node. The implanting of the shallow lightly doped n layer in the first well may produce shallow lightly doped n layer regions in two sides of the control gate of the first well.

Further, in the another exemplary process, the CMOS substrate may include a control gate on each of the wells, wherein the implanting of the at least first and second deep heavily doped n regions in the second well may include implanting three deep heavily doped n regions in the second well, a third and the second of the deep n regions on either sides of the control gate, wherein the third deep n region is configured to operate as a bit-line node. The implanting of the shallow lightly doped p layer in the second well may produce shallow lightly doped p layer regions in two sides of the control gate of the second well.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A memory cell comprising:
   a CMOS substrate having two adjacent wells of opposite conductivity types, having a trench isolation between the wells, wherein a first of the two adjacent wells is connected to a ground voltage level and a second of the two adjacent wells is connected to a constant voltage level;
   a shallow lightly doped n layer in the first of the two adjacent wells;
   a shallow lightly doped p layer in the second of the two adjacent wells;
   at least a first and second deep heavily doped p regions in the first adjacent well, said first deep heavily doped p region adjacent to the trench isolation, so that a shallow n region of the shallow lightly doped n layer is left between said first and second deep heavily doped p regions;
   at least a first and second deep heavily doped n regions in the second of the two adjacent wells, said first deep heavily doped n region adjacent to the trench isolation, so that a shallow p region of the shallow lightly doped p layer is left between said first and second deep heavily doped n regions, wherein the production of the shallow lightly doped n and p layers and the deep heavily doped p and n regions is performed in a same manner used for forming of such elements during a CMOS process; and
   a conductor connecting the first and second deep heavily doped p regions, the shallow n region, the first and second deep heavily doped n regions and the shallow p region to the same input voltage level relative to the ground voltage level, the input voltage level is switchable between the ground voltage level and the constant voltage level.

2. The memory cell of claim 1, further comprising a Shallow Trench Isolation (STI) on sides of the memory cell that isolates the memory cell from neighbor memory cells.

3. The memory cell of claim 1, wherein the CMOS substrate comprises a control gate on the first of the two adjacent wells, further comprising a third deep heavily doped p region in the first of the two adjacent wells, wherein the third and the second deep heavily doped p regions are each on either side of the control gate, and wherein the third deep heavily doped p region is configured to operate as a bit-line node.

4. The memory cell of claim 3, wherein the shallow lightly doped n layer comprises shallow lightly doped n layer regions in two sides of the control gate of the first of the two adjacent wells.

5. The memory cell of claim 1, wherein the CMOS substrate comprises a control gate on the second of the two adjacent wells, further comprising a third deep heavily doped n region in the second of the two adjacent wells, wherein the third and the second deep heavily doped n regions are each on either side of the control gate of the second of the two adjacent wells, and wherein the third deep heavily doped n region is configured to operate as a bit-line node.

6. The memory cell of claim 5, wherein the shallow lightly doped p layer comprises shallow lightly doped p layer regions in two sides of the control gate of the second of the two adjacent wells.

7. The memory cell of claim 1, wherein the CMOS substrate comprises a control gate on each of the two adjacent wells, further comprising a third deep heavily doped p region in the first of the two adjacent wells, wherein the third and the second of the deep heavily doped p regions are each on either side of the control gate of the first well, and further comprising a third deep heavily doped n region in the second of the two adjacent wells, wherein the third and the second of the deep heavily doped n regions are each on either side of the control gate of the second of the two adjacent wells, and wherein at least of the third deep heavily doped n region and the third deep p region is configured to operate as a bit-line node.

8. The memory cell of claim 7, wherein the shallow lightly doped n layer comprises shallow lightly doped n layer regions in two sides of the control gate of the first of the two adjacent wells, and wherein the shallow lightly doped p layer comprises shallow lightly doped p layer regions in two sides of the control gate of the second of the two adjacent wells.

9. The memory cell of claim 1, wherein the shallow lightly doped p layer regions, shallow lightly doped n layer regions, the deep heavily doped p regions and the deep heavily doped n regions of the memory cell, when viewed from above, are arranged sequentially in a row with a constant width.

10. The memory cell of claim 7, wherein at least of the control gates function as a dummy gate in a cut off mode, configured to enable separation of the memory cell from a neighbor memory cell.

\* \* \* \* \*